United States Patent [19]
Ohmine

[11] Patent Number: 5,230,925
[45] Date of Patent: Jul. 27, 1993

[54] GAS-PHASE GROWING METHOD AND APPARATUS FOR THE METHOD

[75] Inventor: Toshimitsu Ohmine, Tokyo, Japan

[73] Assignee: Kabushiki Kaisha Toshiba, Kawasaki, Japan

[21] Appl. No.: 719,628

[22] Filed: Jun. 24, 1991

[30] Foreign Application Priority Data

Jun. 25, 1990 [JP] Japan .................. 2-164209

[51] Int. Cl.$^5$ .............................................. C23L 16/00
[52] U.S. Cl. ........................... 427/255.3; 427/255.1; 427/255.2; 427/294
[58] Field of Search .................. 427/252.2, 294, 255.3, 427/255.1

[56] References Cited

U.S. PATENT DOCUMENTS 3,158,499 11/1964 Jenkin ..................... 427/229
4,138,818 1/1979 Chappelow et al. ............. 427/248.1
4,960,640 10/1990 Paquette et al. ................ 427/248.1

FOREIGN PATENT DOCUMENTS 0371854 6/1990 European Pat. Off. .

OTHER PUBLICATIONS

J. Van Suchtelen et al, The Pulse Reactor-A High-Efficiency, High-Precision Low-Pressure MOCVD Machine, Journal of Crystal Growth, vol. 93, pp. 201-206 (1988), North-Holland, Amsterdam.

Sasaki et al, F.C.C. Niobium Films Grown by Halide Chemical Vapour Deposition on Ultrasound-Vibrating Substrates, Thin Solid Films, vol. 158, pp. 123-131 (1988), The Netherlands.

Primary Examiner—Janyce Bell
Attorney, Agent, or Firm—Oblon, Spivak, McClelland, Maier & Neustadt

[57] ABSTRACT

A gas-phase growing apparatus is provided with a reaction furnace, and a substrate having a minute depression is placed inside the reaction furnace. In the reaction furnace, a reaction gas is supplied onto the substrate, so as to cause gas-phase growth of a layer of a reaction product within the depression of the substrate. The reaction gas is supplied such that the pressure in the reaction furnace is alternately changed between a first pressure and a second pressure. The first pressure is a pressure capable of producing a continuous or intermediate stream in which the collision between the molecules of the reaction gas is predominant, while the second pressure is a pressure lower than the first pressure. The gas-phase growing apparatus is also provided with a pipe for introducing the reaction gas into the reaction furnace, a valve for controlling the flow rate of the reaction gas, a pump for discharging the unconverted reaction gas from the reaction furnace, an orifice for providing flow resistance for the discharge side of the reaction furnace, a pressure meter for measuring the internal pressure of the reaction furnace, and an electromagnetic valve operating in association with the pressure meter.

10 Claims, 7 Drawing Sheets

GAS-PHASE GROWING METHOD AND APPARATUS FOR THE METHOD

BACKGROUND OF THE INVENTION

1. Field of the Invention

The present invention relates to a gas-phase growing method used for the manufacture of semiconductor devices, and also to the apparatus employed for the method.

2. Description of the Related Art

In a conventional CVD apparatus which is in general use, a mixture of a raw gas and a carrier gas is made to flow onto a heated substrate inside a reaction container at a constant rate. An unconverted raw gas is discharged from the reaction container together with the carrier gas. Normally, the CVD apparatus is operated under a constant pressure so as not to disturb the gas stream inside the reaction container.

Figure 13:
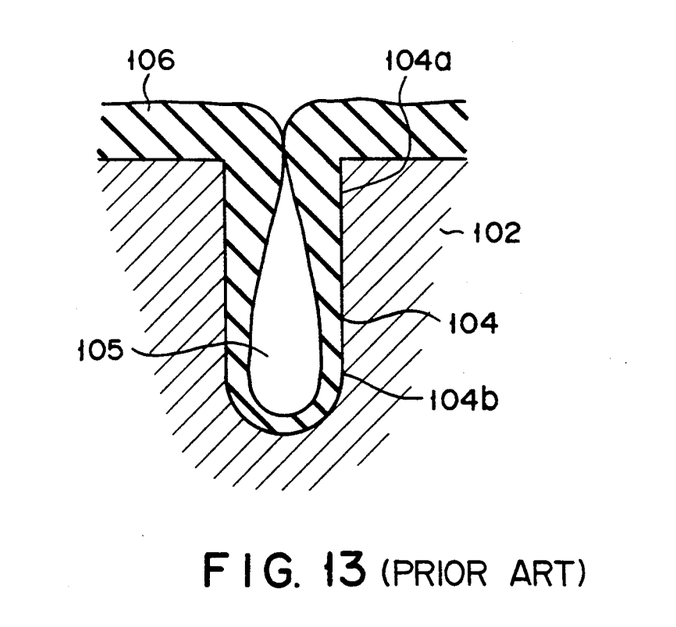
FIG. 13 is an explanatory illustration showing the problems occurring in conventional gas-phase growth.

If a mixed gas containing silane and oxygen is used in the above type of CVD apparatus so as to grow silica (SiO) in a silicon submicron trench (which has come to assume importance in the field of semiconductor devices, such as DRAMs), the problem shown in FIG. 13 occurs. As is shown in FIG. 13, silica 106 grows thick at the inlet 104a of a trench 104 of a substrate 102, while it grows thin in the inside 104b of the trench 104. As a result, a void 105 is left in the inside 104b of the trench 104.

The above problem is related to the size of the trench. If a trench in the substrate is small, like a submicron trench, then the molecules of a gas repeatedly collide against the trench wall when they diffuse into the inside of the trench. Even if a void is not produced, the top surface of the silica formed to fill the trench becomes uneven. A wire cannot be easily connected to such an uneven surface. In addition, $H_2O$, produced by the reaction between the silane and the oxygen, remains inside the trench, adversely affecting the quality of the resultant semiconductor device.

Recently, it is reported that the problem shown in FIG. 13 can be solved by using a combination of both tetra ethoxyl silane (TEOS) and ozone as a raw gas. Even if this method is effective in solving the problem, the effect is limited to the case where SiO is grown. The method does not provide any guarantee of solution to the problem if a different material, such as SiN is grown.

With the conventional gas-phase growing method and apparatus mentioned above, it is difficult to fill the minute trenches of an uneven-surface substrate with the same or different materials, or flatten the uneven surface of that substrate.

SUMMARY OF THE INVENTION

The present invention has been developed in consideration of the above problems, and a primary object of the present invention is to provide a gas-phase growing method and apparatus which enable the minute trenches of an uneven-surface substrate to be uniformly filled with any kind of material or enable the uneven surface of the substrate to be flattened. Another object of the present invention is to remove the gas generated by chemical reaction from the trench.

According to the first aspect of the present invention, there is provided a gas-phase growing method which supplies a reaction gas onto a substrate having a minute trench in a reaction furnace, to thereby form a layer of a reaction product within the minute trench, and in which the supply of the reaction gas is controlled such that the pressure in the reaction furnace is alternately changed between a first pressure capable of producing a continuous or intermediate stream in which the collision between the molecules of the reaction gas is predominant and a second pressure lower than the first pressure.

According to the second aspect of the present invention, there is provided a gas-phase growing method which supplies reaction gases onto a substrate having a minute trench in a reaction furnace, to thereby form a layer of a reaction product within the minute trench, and in which the supply of the reaction gases is controlled such that the pressure in the reaction furnace is alternately changed between a first pressure and a second pressure lower than the first pressure.

According to the third aspect of the present invention, there is provided a gas-phase growing method which supplies a reaction gas onto a substrate having a minute trench in a reaction furnace, to thereby form a layer of a reaction product within the minute trench, and in which acoustic waves are supplied to the substrate.

According to the fourth aspect of the present invention, there is provided a gas-phase growing method which supplies a reaction gas onto a substrate having a minute trench in a reaction furnace, to thereby form a layer of a reaction product within the minute trench, and in which vibrations are supplied to the substrate.

According to the fifth aspect of the present invention, there is provided a gas-phase growing apparatus which supplies a reaction gas onto a substrate having a minute trench in a reaction furnace, to thereby form a layer of a reaction product within the minute trench, and which is provided with a pressure-regulating means for regulating the pressure in the reaction furnace during the gas-phase growth.

According to the sixth aspect of the present invention, there is provided a gas-phase growing apparatus which supplies a reaction gas onto a substrate having a minute trench in a reaction furnace, to thereby form a layer of different reaction products within the minute trench, and which is provided with a means for supplying acoustic waves to the substrate.

According to the seventh aspect of the present invention, there is provided a gas-phase growing apparatus which supplies a reaction gas onto a substrate having minute trenches in a reaction furnace, to thereby form a layer of different reaction products within the minute trench, and which is provided with a means for supplying vibrations to the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
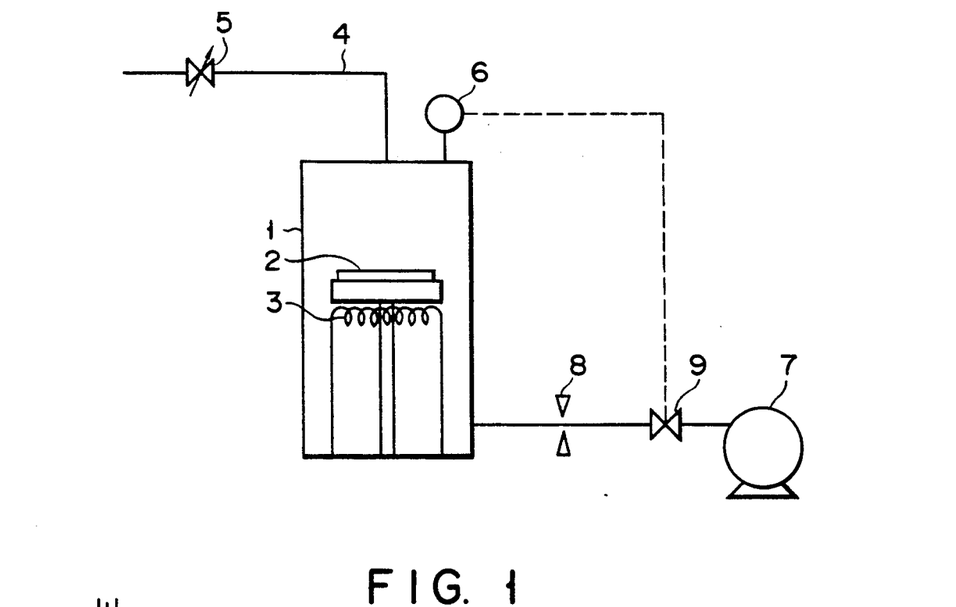
FIG. 1 is a schematic illustration showing a gas-phase growing apparatus according to the first embodiment of the present invention.

FIG. 1 shows a gas-phase growing apparatus according to the first embodiment of the present invention. As is shown in FIG. 1, the apparatus comprises: a reaction furnace 1 in which a substrate 2 is placed and heated; a pipe 4 for introducing a raw gas into the reaction furnace 1; a valve 5 for controlling the flow rate of the raw gas; a pump 7 for discharging the raw gas from the reaction furnace 1; an orifice 8 for providing flow resistance for the discharge side of the reaction furnace 1; a pressure meter 6 for measuring the internal pressure of the reaction furnace 1; and an electromagnetic valve 9 which operates in association with the pressure meter 6. The orifice 8 serves to prevent a reaction product from being scattered in the reaction furnace 1 by providing flow resistance for the discharge side of the reaction furnace 1.

A description will be given of the case where the above apparatus is used for growing polysilicon in a trench of the substrate 2.

First, the electromagnetic valve 9 is opened and the valve 5 is closed, so as to reduce the pressure in the reaction furnace 1. Simultaneous with this, the substrate 2 is heated up to a predetermined temperature.

Figure 2:
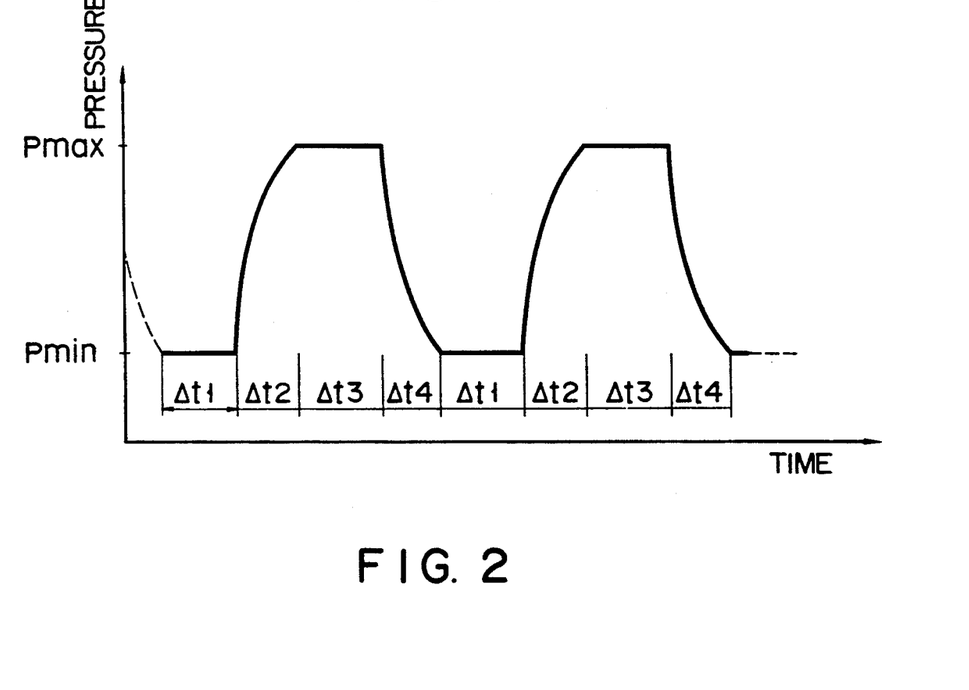
FIG. 2 is a timing chart showing an example of a gas-phase growing method according to the present invention.

Next, silane (i.e., a raw gas) is introduced into the reaction furnace 1, with the valve 5 gradually opened, until internal pressure P of the reaction furnace 1 becomes equal to $P_{min}$ ($P_{min}$: an arbitrary pressure). When the length of time $\Delta t_1$ has elapsed from the time when the valve 5 is opened, the electromagnetic valve 9 is closed. Thereafter, the operation is carried out according to the timing chart shown in FIG. 2. As is shown in FIG. 2, pressure P increases from $P_{min}$ to $P_{max}$ with the lapse of time $\Delta t_2$. Time $\Delta t_3$ after pressure P increases to $P_{max}$, the electromagnetic valve 9 is opened. Time $\Delta t_4$ after the electromagnetic valve 9 is opened, pressure P decreases to pressure $P_{min}$, and time $\Delta t_1$ thereafter the electromagnetic valve 9 is closed. With the operations carried out up to this point being regarded as one cycle, the processing is repeated by the necessary number of cycles.

The value of $P_{max}$ is determined by the following formula:

$$P_{max} \geq 10kT_s/(\sqrt{2}\pi lS^2)$$

where $T_s$ is the temperature of the substrate, k is a Boltzman constant, S is the area of a collision cross section of molecules, and l is the width or diameter of a trench.

Pressure $P_{max}$ expressed by the above formula is a condition of the production of a continuous stream. If pressure $P_{max}$ is lower than that pressure or a pressure which produces an intermediate stream, then the gas molecules cannot enter the interior of the trench without repeatedly colliding against the trench wall. If the gas molecules repeatedly collide against the trench wall, a large amount of polysilicon is deposited on the inlet portion of the trench, as in the case of a conventional constant-stream CVD apparatus. If $P_{max}$ is equal to or higher than $10kT_s/(\sqrt{2}\pi lS^2)$, the gas molecules collide against one another and can therefore swiftly reach the bottom of the trench. Strictly speaking, it takes a certain time for the gas molecules to reach the bottom of the trench, and more than a certain amount of reaction product is inevitably deposited on the inlet portion of the trench.

However, if pressure P is decreased to a pressure in the range of 0.1 to 50% of pressure $P_{max}$, namely to pressure $P_{min}$ the raw gas remaining within the trench cannot be easily discharged. The deeper the trench is, the more difficult it becomes to remove the raw gas from the trench. As a result, the raw gas stays inside the trench for a comparatively long time, and the growing speed of a reaction product is high at the bottom of the trench. Therefore, the problem of the conventional technique can be canceled to a certain extent. Further when the time needed to raise the pressure is shortened ($\Delta t_2 + \Delta t_3$), the raw gas is transferred to the bottom of the trench quickly so that the difference in deposition rate between the inlet portion and the bottom portion is minimized so as not to cause a problem in practice.

Figure 3:
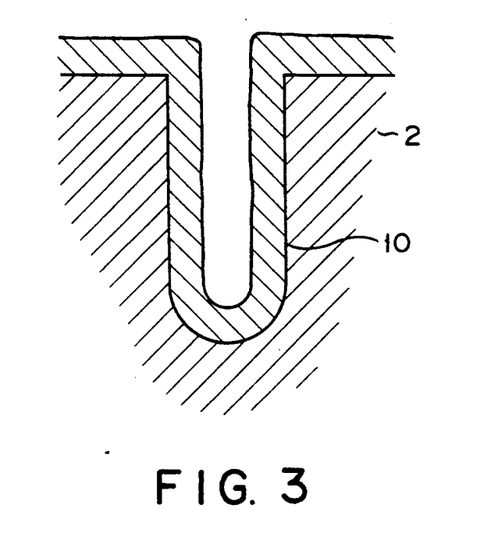
FIG. 3 is a schematic illustration showing the advantages of the present invention.

According to the present invention, valve 5 may be closed substantially simultaneously when electromagnetic valve 9 is opened, so as to increase the pressure-reducing speed during the operation. If valve 5 is closed when electromagnetic valve 9 is opened, the reaction product can be deposited in a satisfactory manner, as is shown in FIG. 3.

As described above, the condition which pressure $P_{max}$ should satisfy is defined by the following equation:

$$P_{max} \geq 10kT_s/(\sqrt{2}\pi lS^2)$$

From a different viewpoint, this condition can also be expressed as follows:

$$K_n = (\lambda/l) \geq 0.01$$

where $K_n$ is a Knudsen number, $\lambda$ is a mean free path of molecules, and l is the representative dimension of the opening of a trench (e.g., the diameter or width of the opening of the trench). Therefore, pressure $P_{max}$ is controlled to satisfy the Knudsen number expressed by the above formula.

The condition of the production of an intermediate stream is expressed by:

$$0.01 < K_n = (\lambda/l) \leq 0.1$$

Therefore, pressure $P_{max}$ is also controlled to satisfy the Knudsen number expressed by this formula.

In the case where a continuous stream is produced, the gas molecules hardly collide against the trench wall; the gas molecules diffuse to the bottom of the trench while colliding against one another. In the case where an intermediate stream is produced, some of the gas molecules may collide against the trench wall, but most of them diffuse to the bottom of the trench while colliding against one other. In either case, the collision between the molecules of the raw gas is predominant, and due to this collision the raw gas can reach the bottom of the trench. Consequently, the advantages noted above can be obtained.

Figure 4:
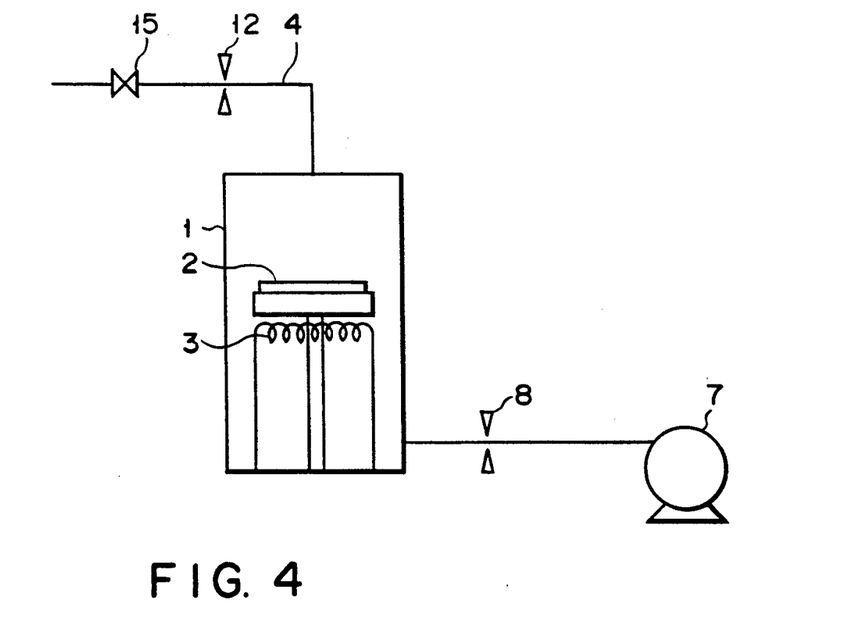
FIGS. 4, 5, 6 and 7 are schematic illustrations showing gas phase growing apparatuses according to the second through fifth embodiments of the present invention, respectively.

FIG. 4 shows the second embodiment of the present invention. As is shown in FIG. 4, a valve 15 and an orifice 12 are provided in a gas-introducing pipe 4, while only an orifice 8 is provided in a gas-discharging pipe (in other words, an electromagnetic valve is not provided for the gas-discharging pipe, as it is in the first embodiment shown in FIG. 1). The alternate switching of pressure is carried out by opening or closing the valve 15 provided in the gas-introducing pipe 4. The purpose for providing the orifice 12 in the gas-introducing pipe 4 is to prevent the pressure in the reaction furnace 1 from rapidly increasing when the valve 15 is opened. In the second embodiment, the gas is constantly discharged from the reaction furnace 1, so that the particles of dust or the like do not flow back into the reaction furnace 1 when the pressure in the reaction furnace 1 increases.

Figure 5:
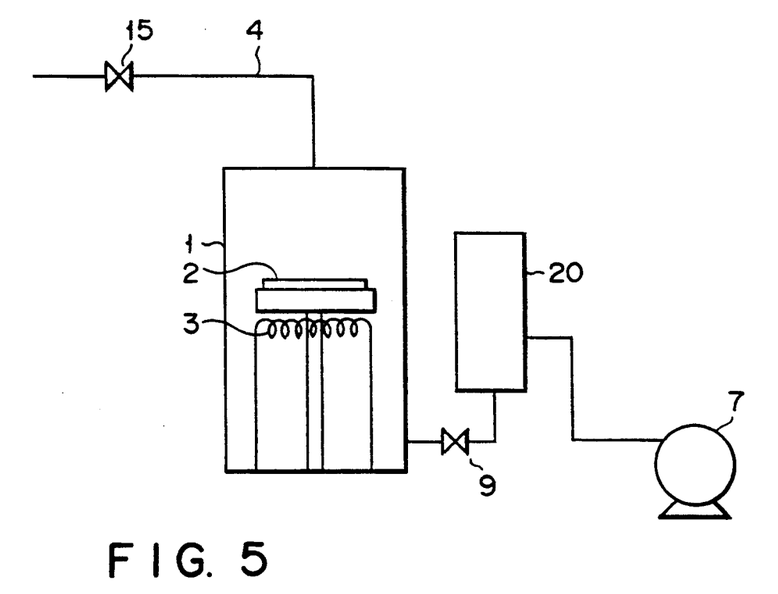
Figure 6:
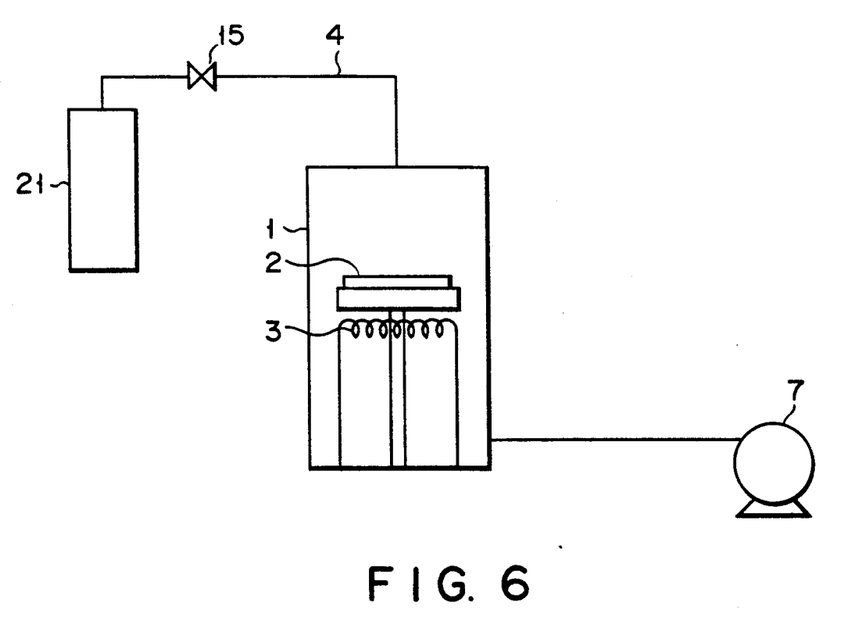

FIG. 5 shows the third embodiment of the present invention. As is shown in FIG. 5, a reservoir tank 20 is provided for a gas-discharge pipe such that the tank 20 is located on the downstream of an electromagnetic valve 9. When the valve 9 is closed, the tank 20 can be maintained in the vacuum state by means of a pump 9. Therefore, when the valve 9 is closed, the pressure in the reaction furnace 1 can be quickly reduced. FIG. 6 shows the fourth embodiment of the present invention. As is shown in FIG. 6, a reservoir tank 21 is provided for gas-introducing pipe 4 such that the tank 21 is located on the upstream of a valve 15. Since a gas to be supplied into a reaction furnace 1 can be stored in the tank 21 beforehand, the pressure in the reaction furnace 1 can be quickly increased when the valve 15 is opened.

The third and fourth embodiments shown in FIGS. 5 and 6 may be combined with each other. In this combination, the reservoir tanks 20 and 21 are provided for the gas-discharging pipe and gas-introducing pipe, respectively. With this structure, it is possible to quickly raise or lower the pressure in the reaction furnace 1.

Figure 7:
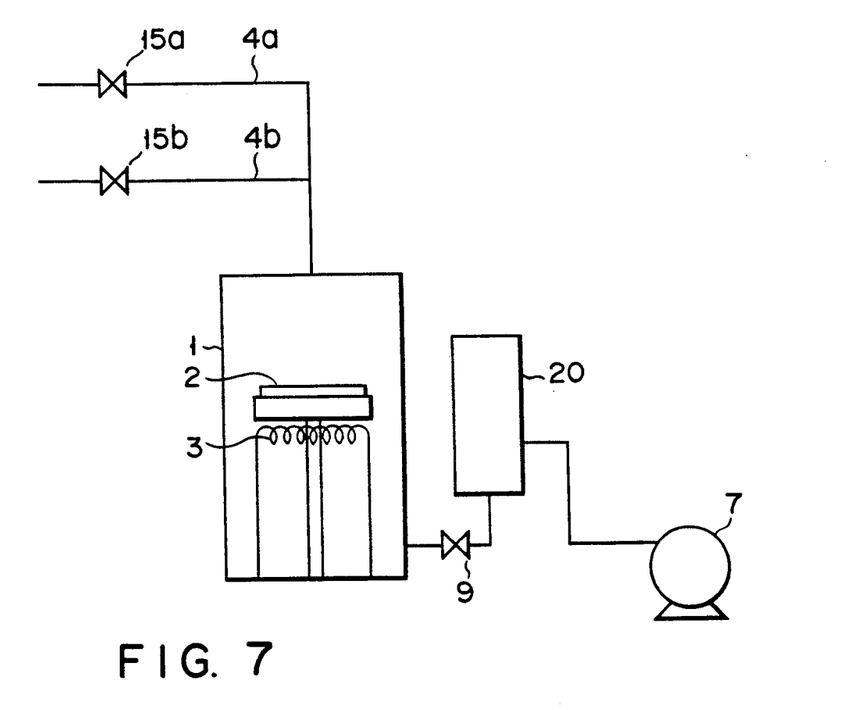

FIG. 7 shows the fifth embodiment of the present invention. In the fifth embodiment, SiO is formed within a trench by supplying silane and oxygen into a reaction furnace 1. The gas-phase growing apparatus shown in FIG. 7 comprises two gas-introducing pipes 4a and 4b, one being used for the supply of $SiH_4$ and the other being used for the supply of $O_2$. The apparatus is operated according to the timing chart shown in FIG. 8.

Figure 8:
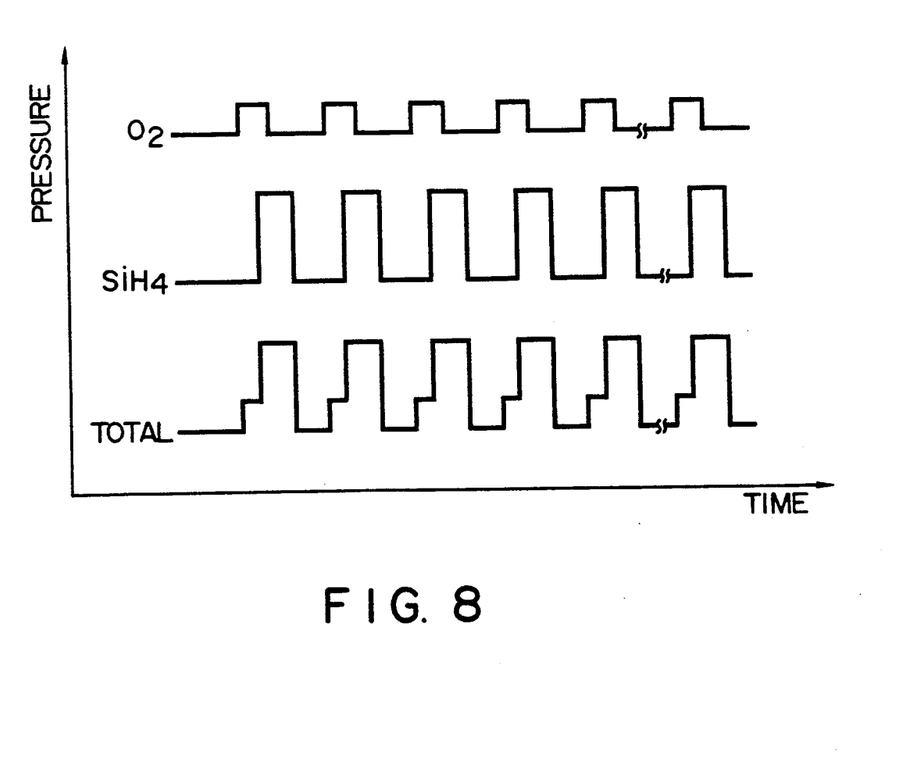
FIG. 8 is a timing chart showing another example of a gas-phase growing method according to the present invention.

Referring to the timing chart shown in FIG. 8, $O_2$ is supplied into a trench after the pressure in the reaction furnace 1 is reduced. Then, $SiH_4$ is supplied, with the result that the pressure in the reaction furnace 1 increases. Thereafter, the supply of both the $O_2$ and $SiH_4$ is stopped, and the reaction furnace 1 is brought nearly into a vacuum state by means of a pump 7. With the operations carried out up to this point being regarded as one cycle, the processing is repeated by the necessary number of cycles.

Figure 9A:
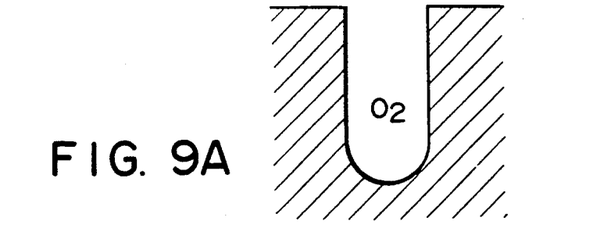
FIGS. 9A, 9B, 9C and 9D are explanatory illustrations showing how gas-phase growth is carried out according to the present invention.
Figure 9B:
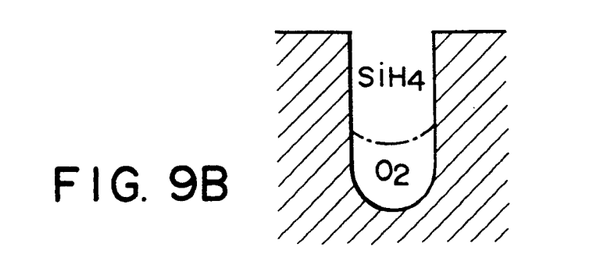
Figure 9C:
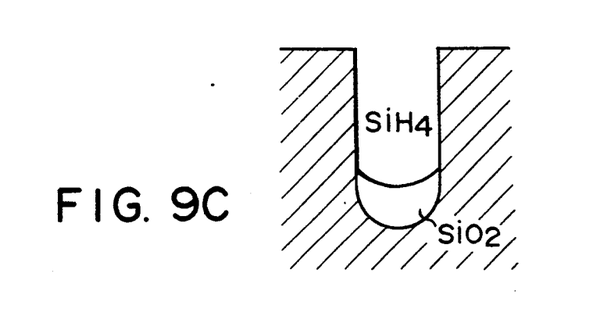
Figure 9D:
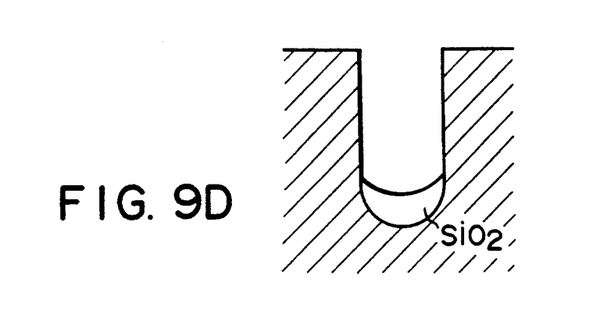

FIGS. 9A–9D show how the gas-phase growth occurs by carrying out the processing mentioned in the preceding paragraph. FIG. 9A shows the state obtained when low-pressure oxygen is supplied. FIG. 9B shows the state obtained when high-pressure $SiH_4$ is supplied. As is shown in FIG. 9B, the low-pressure oxygen moves into to bottom region of the trench due to the supply of the high-pressure $SiH_4$. FIG. 9C shows the state obtained when the $SiH_4$ diffuses into the oxygen and reacts therewith. As is shown in FIG. 9C, $SiO_2$, produced by the reaction between the $SiH_4$ and the $O_2$, is formed in the bottom of the trench. FIG. 9D shows the state where the unconverted gases are discharged from inside the trench by bringing the reaction furnace 1 nearly into a vacuum state. With this cycle repeated, $SiO_2$ is grown first on the bottom of the trench and then on the other portions thereof.

It should be noted that the $O_2$ need not be supplied with its pressure alternately changed between high and low; it may be constantly supplied at a comparatively low pressure.

It should be also noted that the supply of $O_2$ and that of $SiH_4$ need not be carried out in a completely alternate manner. Since these gases remain in the reaction furnace 1 for a certain time, the supply time of $O_2$ and the supply time of $SiH_4$ may partially overlap with each other. Further, a time interval may be given between the supply of $O_2$ and that of $SiH_4$.

It should be also noted that the order of the supply of $O_2$ and that of $SiH_4$ may be reversed, in which $SiH_4$ is supplied in low pressure and then $O_2$ is supplied in high pressure.

Figure 10:
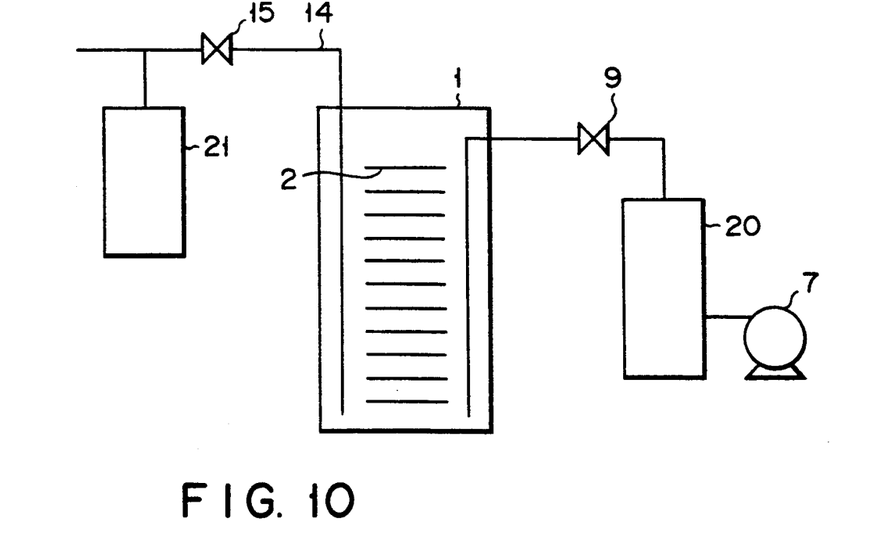
FIG. 10 is a schematic illustration showing a gas-phase growing apparatus according to the sixth embodiment of the present invention.

FIG. 10 shows the sixth embodiment of the present invention. The reaction furnace 1 employed in this embodiment is a vertical diffusion type, and a plurality of substrates 2 are placed inside the reaction furnace 1 and processed simultaneously. The substrates 2 are arranged in the reaction furnace 1 while being vertically spaced from each other by a distance of 5 mm or so. In the sixth embodiment, a raw gas supplied into the reaction furnace 1 uniformly reaches each of the substrates 2, and is discharged from the reaction furnace 1 before the diffusion of the raw gas has an adverse effect on the growth of a reaction product. With this operation repeated, the substrates 2 can be processed in a uniform manner though they are arranged at short intervals. Therefore, the processing can be carried out with high efficiency. In the sixth embodiment, the raw gas is supplied to the substrates 2 in the direction parallel to the substrates 2. Therefore, the substrates 2 are prevented from being blown off by the raw gas introduced.

In order to alternately change the pressure in the reaction furnace 1 between $P_{max}$ (which produces a continuous or intermediate stream) and $P_{min}$ (which is an arbitrary pressure lower than $P_{max}$), a pressure-regulating means made by a piston and a cylinder may be employed in the sixth embodiment.

According to the first through sixth embodiments mentioned above, a raw material in the state of either a continuous stream or an intermediate stream is supplied to a minute depression of a substrate placed in a low-pressure atmosphere, so that the raw material can be uniformly fed to the minute depression, even to the bottom thereof. In the case where the conventional technique is used, a layer of reaction product is formed at high speed at the inlet portion of a minute depression and in some cases covers the depression, but this problem does not occur in the first through sixth embodiments of the present invention. In addition, due to the pressure-reducing step used in the embodiments, an auxiliary reaction product does not remain inside the depression, as it does in the conventional case. Therefore, the embodiments enable the growth of a thin film free of impurities. Further, even if a plurality of substrates are processed simultaneously, they can be processed uniformly, without reference to the shape of the reaction furnace.

In the present invention, the need to alternately change the pressure of a supply gas or gases between high and low can be eliminated by utilizing acoustic waves. This is because an increase of the alternate frequency of pressure ultimately results in acoustic waves. Where acoustic waves are utilized, the surface of a substrate can be processed under a varying pressure, with no need to turn on or off the valves as in the foregoing embodiments.

When acoustic waves are utilized in the present invention, it is preferable that the absolute value of a pressure variation be increased by application of a low frequency (e.g., a frequency of several tens of Hz). It is also preferable that the wavelength be controlled to correspond to one of the representative dimensions (e.g., the depth) of a trench by application of a high frequency (e.g., a frequency of several tens of MHz), so as to permit the acoustic waves to reach the bottom of the trench.

Figure 11:
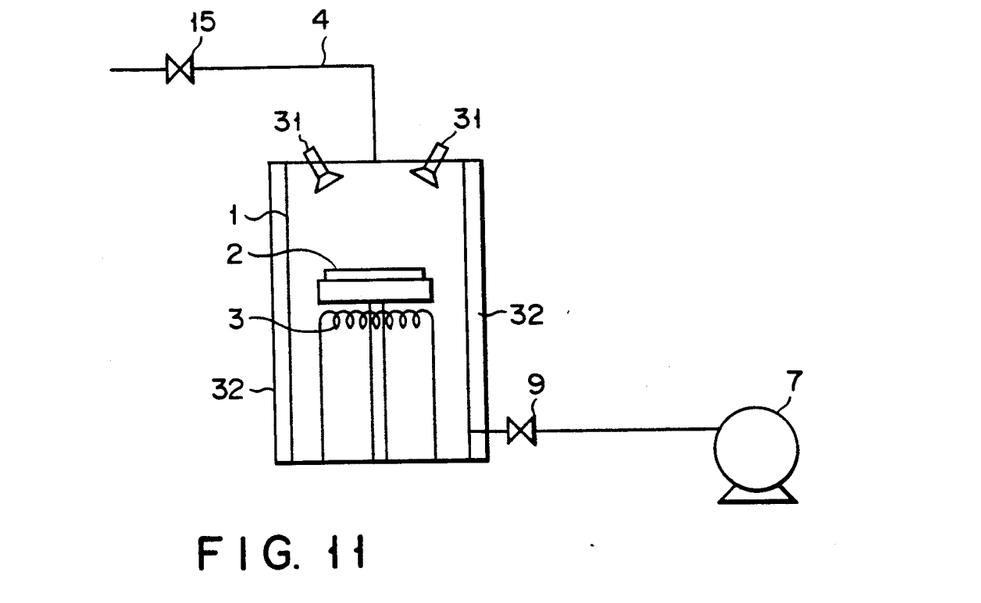
FIGS. 11 and 12 are schematic illustrations showing the seventh and eight embodiments, respectively, in both of which acoustic waves are utilized.

FIG. 11 shows the seventh embodiment of the present invention, in which embodiment acoustic waves are utilized on the basis of the above technical idea. As is shown in FIG. 11, a pair of speakers 31 are located in the upper region of a reaction furnace 1, and the furnace 1 is surrounded by a sound-shielding wall 32.

In the present invention, almost the same effect as that obtained by alternately changing the pressure of a supply gas or gases can be obtained by vibrating the substrate. More specifically, low or high frequency vibrations are selected based on the same concept as that of acoustic waves.

Figure 12:
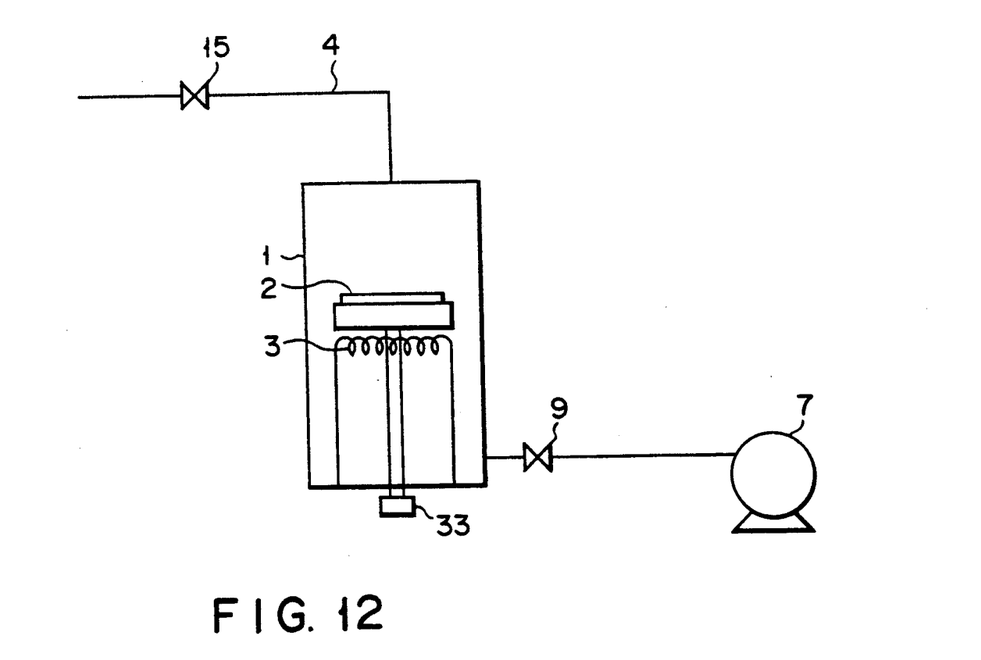

FIG. 12 shows the eight embodiment of the present invention, in which vibration of the substrate is utilized. As is shown in FIG. 12, an ultrasonic vibration element 33 is attached to the lower end of a rotating shaft used for supporting a substrate 2 so that minute vibrations are added to the substrate.

The present invention is not limited to the embodiments mentioned above, and may be modified in various manners without departing from the spirit and scope thereof when it is put to practical use.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A gas-phase growing method, wherein:
   first and second reaction gases of different kinds are supplied to a substrate having a minute depression and located in a reaction furnace to thereby form a layer of a reaction product within the minute depression;
   said reaction gases are supplied such that pressure in the reaction furnace is alternately changed between a first pressure and a second pressure which is lower than said first pressure; and
   wherein said first reaction gas is supplied continuously, and said second reaction gas is supplied in pulsation or stepwise with a pressure higher than that of the first reaction gas.

2. A method according to claim 1, wherein said first pressure is determined to satisfy:

$$K_n = (\lambda/l) \geq 0.1$$

where $K_n$ is a Knudsen number, $\lambda$ is a mean free path of molecules of said reaction gas, and $l$ is the representative width of the depression.

3. A method according to claim 1, wherein said second pressure is lower than $\frac{1}{2}$ of said first pressure.

4. A gas-phase growing method, wherein:
   first and second reaction gases of different kinds are supplied onto a substrate having a minute depression and located in a reaction furnace, to thereby form a layer of a reaction product within the minute depression;
   said reaction gases are supplied such that pressure in the reaction furnace is alternately changed at least between a first pressure and a second pressure lower than the first pressure; and
   said first and second reaction gases are supplied in first and second pulsation modes, respectively, said first and second modes having the same periodic frequency, said first and second modes having first and second phases, respectively, which characterize when pulses of the first and second reaction gases occur during a period of said periodic frequency and said first and second phases are not equal.

5. A method according to claim 4, wherein each of pulses of the first mode partially temporally overlap with a pulse of the second mode.

6. A method according to claim 5, further comprising the steps of:
   evacuating the reaction furnace;
   starting supply of the first reaction gas into the reaction furnace so as to change the pressure therein to the second pressure;
   starting supply of the second reaction gas into the reaction furnace after starting supply of the first reaction gas so as to change the pressure therein to the first pressure;
   (a) stopping supply of the first reaction gas after starting supply of the second reaction gas; and then
   (b) stopping supply of the second reaction gas after stopping supply of the first reaction gas;
   wherein the sequence of steps (a) and (b) are repeated more than once.

7. A method according to claim 6, wherein the first gas is $O_2$ and the second gas is $SiH_4$.

8. A method according to claim 6, wherein the first gas is $SiH_4$ and the second gas is $O_2$.

9. A method according to claim 4, wherein:
   said first pressure is determined to satisfy $$K_n = (\lambda/l) \geq 0.1$$

where $K_n$ is a Knudsen number, $\lambda$ is a mean free path of molecules of said reaction gas, and $l$ is the representative width of the depression.

10. A method according to claim 4, wherein:
    said second pressure is lower than $\frac{1}{2}$ of said first pressure.

* * * * *